(12) United States Patent
Park

(10) Patent No.: US 8,476,943 B2
(45) Date of Patent: Jul. 2, 2013

(54) SEMICONDUCTOR DEVICE

(75) Inventor: Jung-Hoon Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 888 days.

(21) Appl. No.: 12/345,079

(22) Filed: Dec. 29, 2008

(65) Prior Publication Data

US 2010/0060329 A1    Mar. 11, 2010

(30) Foreign Application Priority Data

Sep. 10, 2008   (KR) .................. 10-2008-0089165

(51) Int. Cl.
*H04L 7/00*   (2006.01)

(52) U.S. Cl.
USPC .......................................... 327/141; 375/371

(58) Field of Classification Search
USPC .................. 375/537, 373, 371, 376, 359, 316
See application file for complete search history.

(56) References Cited

U.S. PATENT DOCUMENTS

| | | | |
|---|---|---|---|
| 6,583,674 B2 * | 6/2003 | Melava et al. .................. | 331/16 |
| 2008/0072093 A1 * | 3/2008 | Baumgartner et al. ....... | 713/400 |

FOREIGN PATENT DOCUMENTS

| | | |
|---|---|---|
| KR | 1020010073884 A | 8/2001 |
| KR | 1020080044543 A | 5/2008 |

OTHER PUBLICATIONS

Richard C. Walker, Designing Bang-Bang PLLs for Clock and Data Recovery in Serial Data Transmission Systems, 2003, IEEE press.*
Notice of Allowance issued from Korean Intellectual Property Office on Jan. 27, 2010.

* cited by examiner

*Primary Examiner* — Daniel Washburn
*Assistant Examiner* — Wednel Cadeau
(74) *Attorney, Agent, or Firm* — IP & T Group LLP

(57) ABSTRACT

A semiconductor device includes: a clock input unit configured to receive a system clock and a data clock externally; a phase dividing unit configured to generate a plurality of multi-system clocks in response to the system clock, wherein each of the multi-system clocks has an individual phase difference; a phase detecting unit configured to detect phase differences between the plurality of multi-system clock and the data clock and to generating generate a training information signal in response to the detection result; and a signal transmitting unit configured to transmit the training information signal.

21 Claims, 8 Drawing Sheets

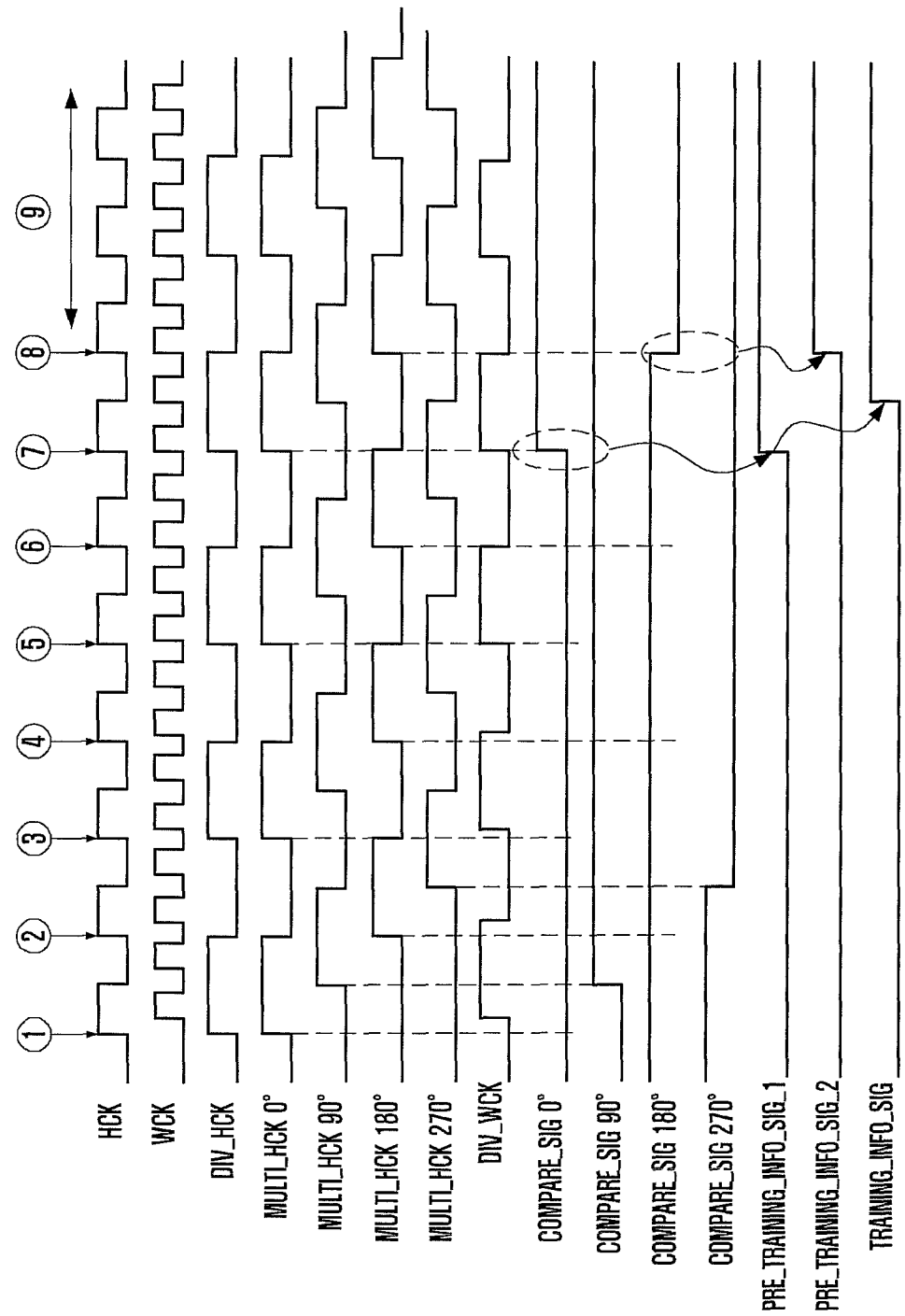

US 8,476,943 B2

SEMICONDUCTOR DEVICE

CROSS-REFERENCE TO RELATED APPLICATION

The present invention claims priority of Korean patent application number 10-2008-0089165, filed on Sep. 10, 2008, which is incorporated by reference in its entirety.

BACKGROUND OF THE INVENTION

The present invention relates to a clock alignment training operation required for a semiconductor device operating at high speed as a semiconductor design technology, and more particularly, to a circuit for performing a clock alignment training operation stably even in the semiconductor device operating at higher speed.

A semiconductor device is a device for storing data in a system including a plurality of semiconductor devices. For example, data are required in a data processing device such as a Memory Control Unit (MCU), a semiconductor device outputs data corresponding to an address inputted from a device requiring the data or stores the data supplied from the data requiring device at a position corresponding to the address.

For this, recent memory devices operating at high speed are designed to input/output two data between a rising edge and a falling edge of a system clock applied from outside and to input/output two data between the falling edge and a following rising edge. In short, they are designed to input/output four data in one period of the system clock.

However, since the system clock is represented by only two states, i.e., a logic high level or a logic low level, in order to input/output four data at one period, a data clock having a frequency two times faster than the system clock is required. That is, there is a dedicated clock for inputting/outputting data.

Therefore, the semiconductor device operating at high speed is controlled to allow a data clock to have a frequency twice faster than a system clock by using a system clock as a reference clock while an address and a command are transmitted and received and using a data clock as the reference clock while the data is inputted/outputted.

That is, four data can be inputted/outputted at one period of the system clock by allowing the data clock to repeat two periods at one period of the system clock and to generate the data input/output at a rising edge and a falling edge, respectively.

Like this, differently from a related Double Data Rate (DDR) synchronization memory device using one system clock as a reference to perform operations of reading or writing, the semiconductor device operating at high speed transmits and receives data by using two clocks having frequencies different from each other to perform an operation of reading or writing.

However, if the system clock is not aligned with the data clock, it means that a criterion for transmitting an operation command and an address is not aligned with a criterion for transmitting data and that the semiconductor device operating at high speed does not operate normally.

Accordingly, in order to operate the semiconductor device operating at high speed normally, an operation such as interface training should be performed between the semiconductor device and a data processing device at an initial operation.

Herein, the interface training means a training to operate at a time when an interface for transmitting commands, addresses and data is optimized before a normal operation between the semiconductor device and the data process device is performed.

Such interface training is divided into address training, clock alignment training, a WCK2CK training, a reading training, a writing training and the like. For these trainings, an operation of aligning the data clock and the system clock is performed in the clock alignment training, and the WCK2CK training.

FIG. 1 is a block diagram illustrating a circuit for performing clock alignment training according to a related art.

Firstly, a basic principle of the clock alignment training is explained, the semiconductor device operating at high speed receives an address signal and a command signal from an external controller with reference to a system clock HCK as described above and outputs the data stored inside the semiconductor device with reference to a data clock WCK to the external controller.

Therefore, if a phase difference exists between the system clock HCK and the data clock WCK, the data stored inside the semiconductor device arrives at the external controller slower or faster by the time corresponding to the phase difference.

Therefore, the clock alignment training is an operation for reducing the phase difference between the system clock HCK and the data clock WCK by detecting the phase difference between the system clock HCK and the data clock WCK applied from the external controller at an initial operation of the semiconductor device operating at high speed and transmitting the detection result to the outside controller.

That is, a circuit for performing the clock alignment training according to the related art shown in FIG. 1 is a circuit for performing an operation to receive the system clock HCK and the data clock WCK from the external controller, detect the phase difference therebetween, and transmit the detection result to the external controller.

Referring to FIG. 1, the circuit includes a clock input unit 100, a frequency converting unit 120, a phase detecting unit 140 and a signal transmitting unit 160. The clock input unit 100 receives an external data clock OUT_WCK and an external system clock OUT_HCK to output the system clock HCK for synchronizing input timings of the address signal and the command signal, and the data clock WCK for synchronizing input timings of the data signals from the external controller. The data clock WCK has a frequency higher than that of the system clock HCK.

The frequency converting unit 120 generates a data dividing clock DIV_WCK by dividing a frequency of the data clock WCK in such a manner that the data dividing clock DIV_WCK has the same frequency as that of the system clock HCK. The phase detecting unit 140 detects the phase difference between the system clock HCK and the data dividing clock DIV_WCK and generates a detection signal DET_SIG corresponding to the result. The signal transmitting unit 160 transmits the detection signal DET_SIG to the external controller as a training information signal TRAINING_INFO_SIG.

FIG. 2 is a timing diagram showing an operational waveform of the circuit for performing the clock alignment training according to the related art shown in FIG. 1.

As shown, although the frequency of the data clock WCK inputted into the circuit for performing the clock alignment training according to the related art in the external controller is higher than the frequency of the system clock HCK, since the frequency of the data clock WCK becomes equal to the frequency of the system clock HCK by converting the frequency of the data clock WCK in the frequency converting unit 120, it is noted that the frequency of the data clock DIV_WCK outputted in the frequency converting unit 120 is equal to the frequency of the system clock HCK.

Also, before the clock alignment training operation is started ①, it is noted that a clock edge is not a state of being synchronized with each other. That is, before the clock alignment training operation is started ①, it is noted that the phases of the data clock WCK and the data dividing clock DIV_WCK are not synchronized with that of the system clock HCK.

After the clock alignment training operation is started ②, ③, ④, ⑤ and ⑥, it is noted that phases of the data clock WCK and the data dividing clock DIV_WCK can be changed at a state of fixing the phase of the system clock as a method for synchronizing the phases of the data clock WCK and the data dividing clock DIV_WCK with the phase of the system clock HCK.

At this time, the phases of the data clock WCK and the data dividing clock DIV_WCK are changed corresponding to a logic level of the training information signal TRAINING_INFO_SIG transmitted to the external controller by the signal transmitting unit 160. That is, since the logic level of the training information signal TRAINING_INFO_SIG is a state of a logic low level continuously, the phases of the data clock WCK and the data dividing clock DIV_WCK are slightly changed to apply the changed phases to a circuit for performing the clock alignment training in the external controller.

Thereafter, at the time of synchronizing the phases between the data clock WCK and the data dividing clock DIV_WCK, and the system clock HCK ⑥, the logic level of the training information signal TRAINING_INFO_SIG is changed into a logic high level from a logic low level and the phases of the data clock WCK and the data dividing clock DIV_WCK are not changed further in a period ⑦ maintaining such state continuously. In other words, since the logic level of the training information signal TRAINING_INFO_SIG is changed into a logic high level, the phases of the data clock WCK and the data dividing clock DIV_WCK are fixed in the external controller to apply the fixed phases to a circuit for performing the clock alignment training.

Finally, after the circuit for performing the clock alignment training compares the data clock WCK with the system clock HCK in the phase detection unit 140 continuously until the phases of the data clock WCK and the system clock HCK inputted from the external controller are synchronized through the clock alignment training operation, it is noted that the circuit for performing the clock alignment training transmits the comparison result, i.e., the training information signal, TRAINING_INFO_SIG to the external controller.

In this way, seeing a structure of the circuit for performing the clock alignment training according to the related art with reference to FIG. 1, the data clock WCK and the system clock HCK applied through the clock input unit 100 are applied to the phase detecting unit 140 through clock paths different from each other, and the lengths of the clock paths are relatively long.

While the data clock WCK and the system clock HCK pass the relatively long clock paths that are different from each other, there is a problem in that the clock is distorted or disappears by generating noises in any one clock path or all clock paths during the passing.

In case that such a problem occurs, since the result outputted from the phase detecting unit 140 is not reliable, another problem of consuming a relatively a large amount of time occurs due to additional operations such as performing the clock training operation again from the beginning.

The above described problems may occur frequently when the data clock WCK and the system clock HCK are of high frequencies. Consequently, in the semiconductor device operating at higher speed, the clock alignment training operation may not be performed stably.

SUMMARY OF THE INVENTION

Some embodiments of the present invention are directed to providing a circuit for performing a clock alignment training to perform the clock alignment training operation stably even in the semiconductor device operating at high frequency. Simultaneous detection of phases of a system clock and a data clock and extraction of the final phase detection result may be performed.

In accordance with an aspect of the present invention, there is provided a semiconductor device, including: a clock input unit configured to receive a system clock and a data clock externally (for example, from outside the semiconductor device); a phase dividing unit configured to generate a plurality of multi-system clocks in response to the system clock, wherein each of the multi-system clocks has an individual phase difference; a phase detecting unit configured to detect phase differences between the plurality of multi-system clock and the data clock and to generate a training information signal in response to the detection result; and a signal transmitting unit configured to transmit the training information signal.

In accordance with another aspect of the present invention, there is provided a semiconductor device, including: a clock input unit configured to receive a system clock and a data clock externally; a phase dividing unit configured to generate a plurality of multi-system clocks having an individual phase difference based on the system clock; a clock dividing unit configured to generate a data dividing clock with the same frequency as the plurality of multi-system clocks by dividing a frequency of the data clock; a phase detecting unit configured to detect phase differences between the plurality of multi-system clock and the data dividing clock to generate a training information signal in response to the detection result; and a signal transmitting unit configured to transmit the training information signal.

In accordance with still another aspect of the present invention, there is provided a semiconductor device, including: a clock input unit configured to receive a system clock and a data clock externally; a first clock dividing unit for dividing a frequency of the system clock by a first ratio to output a system dividing clock; a phase dividing unit configured to generate a plurality of multi-system dividing clocks having an individual phase in response to the system dividing clock; a second clock dividing unit configured to divide a frequency of the data clock by a second ratio to generate a data dividing clock; a phase detecting unit configured to detect phase differences between the plurality of multi-system dividing clocks and the data dividing clock respectively to generates a training information signal in response to the detection result; and a signal transmitting unit configured to transmit the training information signal.

BRIEF DESCRIPTION OF THE DRAWINGS

FIG. 8 is a timing diagram illustrating an operational waveform of the circuit for performing the clock alignment training in accordance with the second embodiment of the present invention shown in FIG. 7.

DESCRIPTION OF SPECIFIC EMBODIMENTS

Other objects and advantages of the present invention can be understood by the following description, and become apparent with reference to the embodiments of the present invention.

Hereafter, preferred embodiments of the present invention will be described with reference to the accompanying drawings. However, the present invention is not limited to the embodiments disclosed hereafter, and can be modified into diverse forms. The embodiments of the present invention are provided as examples without limiting the scope of the present invention.

[Embodiment 1]

Figure 1:
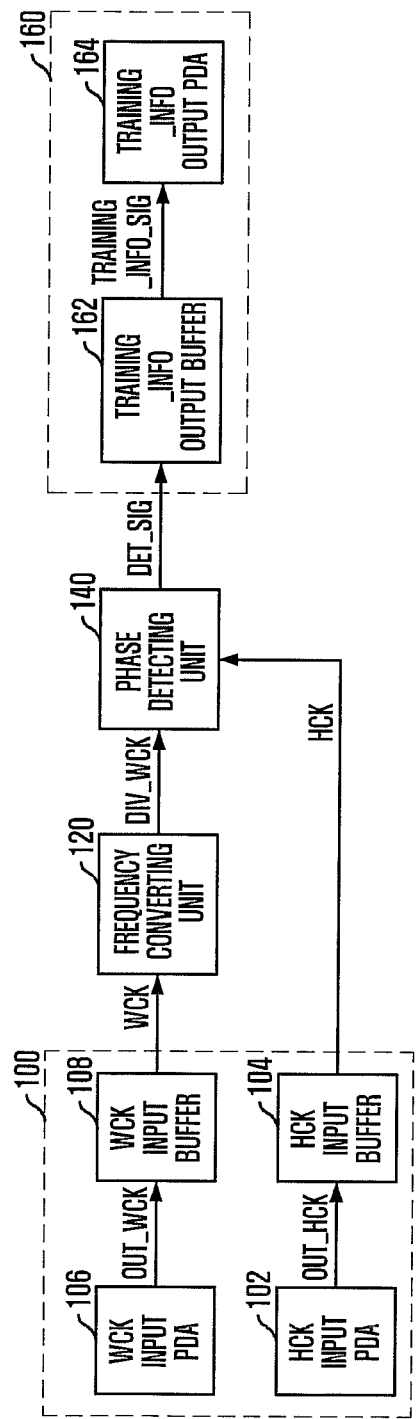
FIG. 1 is a block diagram showing a circuit for performing clock alignment training according to a related art.
Figure 2:
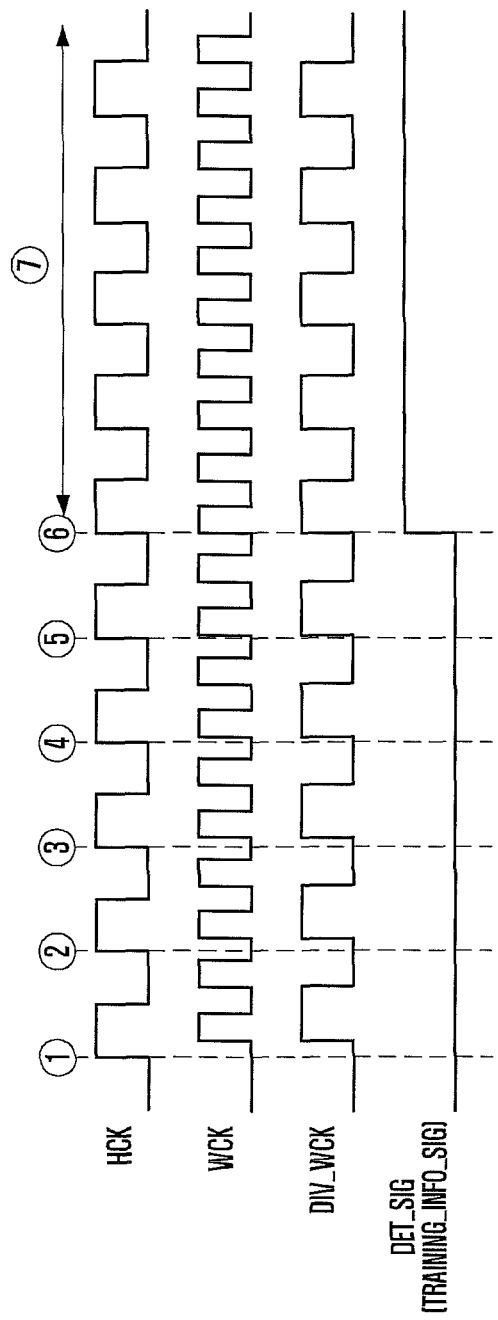
FIG. 2 is a timing diagram illustrating an operational waveform of the circuit for performing the clock alignment training according to the related art shown in FIG. 1.
Figure 3:
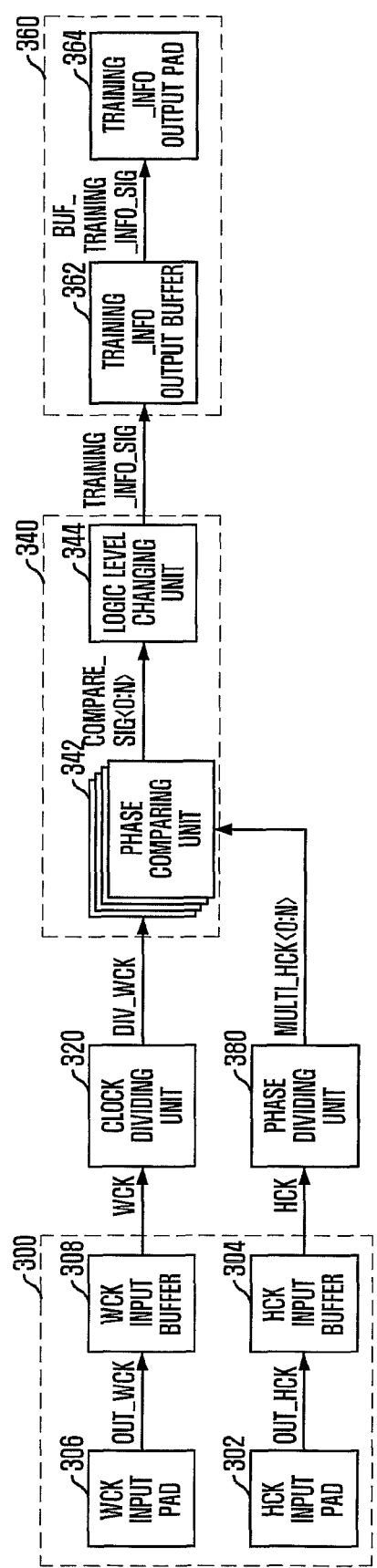
FIG. 3 is a block diagram showing a circuit for performing clock alignment training in accordance with a first embodiment of the present invention.

FIG. 3 is a block diagram showing a circuit for performing clock alignment training in accordance with a first embodiment of the present invention.

Referring to FIG. 3, the circuit includes a clock input unit 300, a phase dividing unit 380, a clock dividing unit 320, a phase detecting unit 340 and a signal transmitting unit 360.

The input unit 300 receives an external data clock OUT_WCK and an external system clock OUT_HCK to output a system clock HCK for synchronizing input timings of an address signal and a command signal and a data clock WCK for synchronizing input timings of the data signals from the external controller. The data clock WCK has a frequency higher than that of the system clock HCK.

The phase dividing unit 380 generates a plurality of multi-system clocks MULTI_HCK<0:N> having a phase difference of a dedicated size respectively in response to the system clock HCK. The clock dividing unit 320 generates a data dividing clock DIV_WCK by dividing a frequency of the data clock WCK in such a manner that the data dividing clock DIV_WCK has the same frequency as those of the multi-system clocks MULTI_HCK<0:N>.

The phase detecting unit 340 detects the phase difference between the multi-system clocks MULTI_HCK<0:N> and the data dividing clock DIV_WCK and generates a training information signal TRAINING_INFO_SIG corresponding to the result. The signal transmitting unit 360 transmits the training information signal TRAINING_INFO_SIG to the external controller.

The phase detection unit 340 includes a plurality of phase comparing units 342 and a logic level changing unit 344. The plurality of phase comparing units 342 compare the phases between the plurality of multi-system clocks MULTI_HCK<0:N> and the data dividing clock DIV_WCK respectively. The logic level changing unit 344 changes a logic level of the training information signal TRAINING_INFO_SIG in response to a plurality of comparing signals COMPARE_SIG<0:N> output from the phase comparing units 342.

The clock input unit 300 includes a system clock input pad HCK INPUT PAD 302 and a system clock input buffer 304, a data clock input pad 306 and a data clock input buffer 308.

The system clock input pad HCK INPUT PAD 302 receives the external system clock OUT_HCK applied from the external controller. The system clock input buffer 304 buffers the external system clock OUT_HCK transmitted through the system clock input pad HCK INPUT PAD 302 to output the buffered signal as the system clock HCK.

The data clock input pad WCK INPUT PAD 306 receives the external data clock OUT_WCK applied from the external controller. The external data clock OUT_WCK has a frequency higher than that of the external system clock OUT_HCK applied from the external controller. The data clock input buffer 308 buffers the external data clock OUT_WCK transmitted through the data clock input pad WCK INPUT PAD 306 to output the buffered signal as the data clock WCK.

Also, the signal transmitting unit 360 includes a training information signal output buffer 362 and a training information signal output pad TRAINING_INFO_SIG 364.

The training information signal output buffer 362 buffers the training information signal TRAINING_INFO_SIG to output a buffered training information signal BUF_TRAINING_INFO_SIG. The training information signal output pad TRAINING_INFO_SIG 364 transmits the buffered training information signal BUF_TRAINING_INFO_SIG to the external controller from the training information signal output buffer 362.

Figure 4:
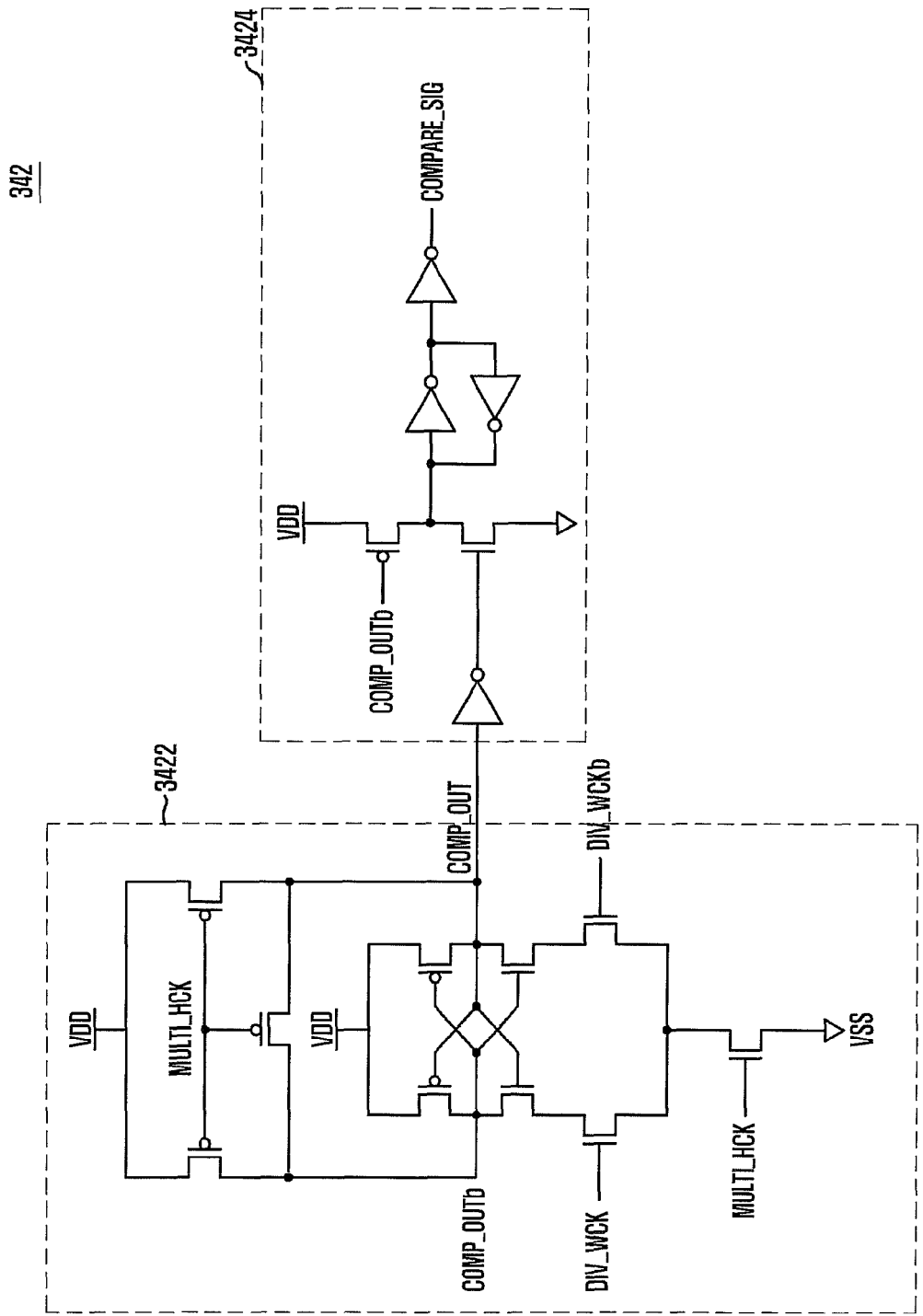
FIG. 4 is a circuit diagram illustrating a plurality of phase comparing units included in a phase detecting unit of the circuit for performing the clock alignment training in accordance with the first embodiment of the present invention shown in FIG. 3.

FIG. 4 is a circuit diagram illustrating the plurality of phase comparing units 342 included in the phase detecting unit 340 for performing the clock alignment training in accordance with the first embodiment of the present invention shown in FIG. 3.

Referring to FIG. 4, the plurality of phase comparing units 342 includes a comparing amplification unit 3422 and logic level determining unit 3424.

The comparing amplification unit 3422 is configured in a sense amplification shape for comparing the phases of the data dividing clock DIV_WCK with reference to a phase of corresponding one of the plurality of multi-system clocks MULTI-HCK<0:N>. The logic level determining unit 3424 determines a logic level of the comparing signal COMPARE_SIG of each of the phase comparing units 342 in response to output signals COMP_OUT and COMP_OUTb output from the comparing amplification unit 3422.

While the detailed circuit of the plurality of phase comparing units shown in FIG. 4 is an exemplary embodiment suggested for facilitating the understanding of the present invention, it can be differently formed as well. That is, if a circuit is capable of sufficiently performing operations of the plurality of phase comparing units 342 to be explained hereafter, it can be used by being included into the first embodiment of the present invention instead of the detailed circuit of the plurality of the phase comparing units 342 shown in FIG. 4.

Figure 5:
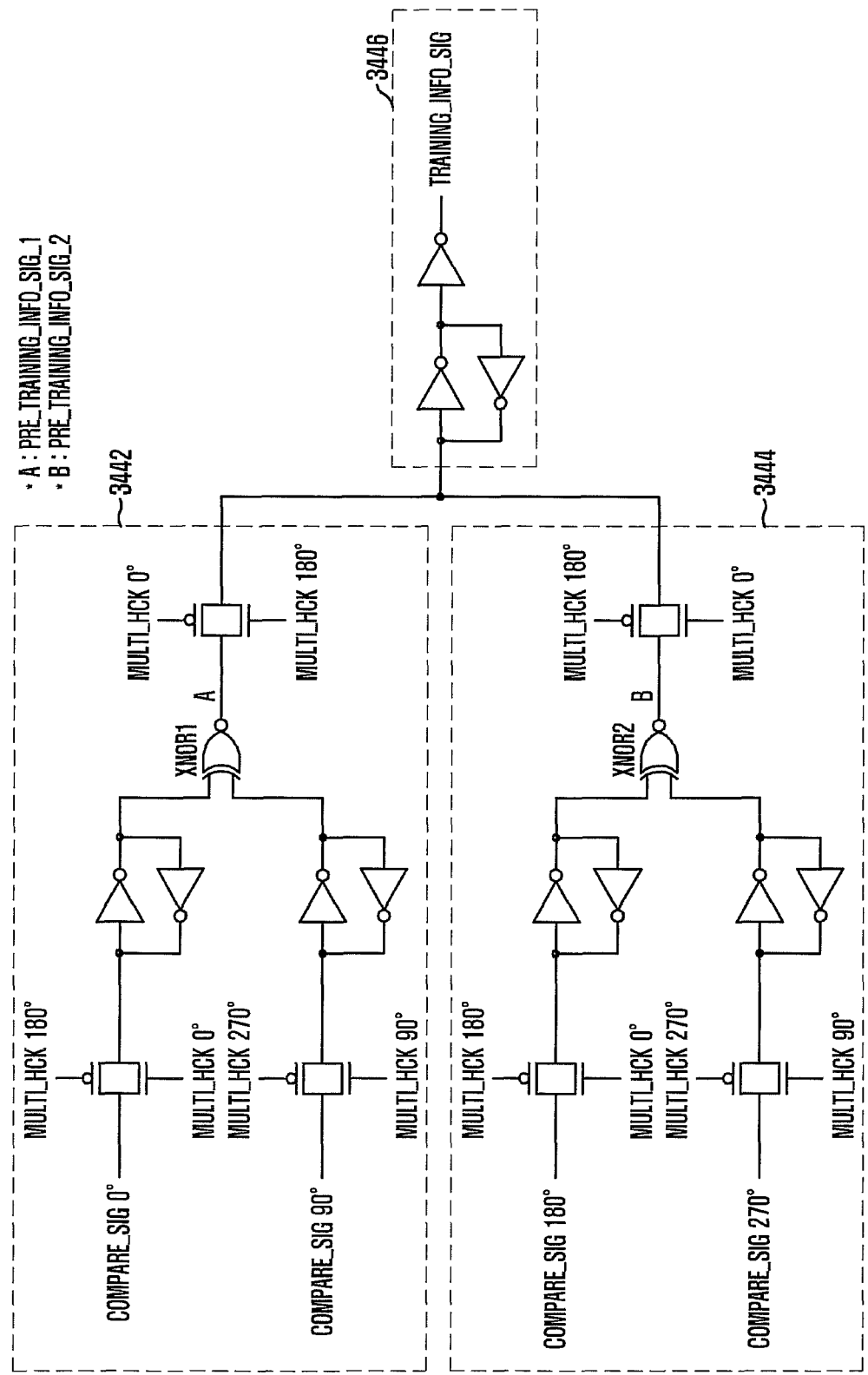
FIG. 5 is a circuit diagram illustrating a logic level changing unit included in the phase detecting unit of the circuit for performing the clock alignment training in accordance with the first embodiment of the present invention shown in FIG. 3.

FIG. 5 is a circuit diagram illustrating the logic level changing unit 344 included in the phase detecting unit 340 of the circuit for performing the clock alignment training in accordance with the first embodiment of the present invention shown in FIG. 3.

It is assumed that the phase dividing unit 380 shown in FIG. 3 generates four multi-system clocks MULTI_HCK 0°, MULTI_HCK 90°, MULTI_HCK 180° and MULTI_HCK 270° having a phase difference of 90° respectively by dividing the system clock HCK into 4 different phases. It is also assumed that the phase comparing unit 342 compares the phases between four multi-system clocks MULTI_HCK 0°, MULTI_HCK 90°, MULTI_HCK 180° and MULTI_HCK 270° with the data dividing clock DIV_WCK, and outputs four comparing signals COMPARE_SIG 0°, COMPARE_SIG 90°, COMPARE_SIG 180° and COMPARE_SIG 180° in parallel.

Referring to FIG. 5, the logic level changing unit 344 includes a first logic level comparing unit 3442, a second logic level comparing unit 3444 and a logic level determining unit 3446.

The first logic level comparing unit 3442 performs an exclusive NOR operation on a first comparing signal COMPARE_SIG 0° and a second comparing signal COMPARE_SIG 90° among four comparing signals COMPARE_SIG 0°, COMPARE_SIG 90°, COMPARE_SIG 180° and COMPARE_SIG 270° respectively outputted from four phase comparing units 342.

The first logic level comparing unit 3442 activates a first pre-training information signal A: PRE_TRAINING_INFO_SIG_1 into a logic high level when the logic levels of the first and second comparing signals COMPARE_SIG 0° and COMPARE_SIG 90° are equal to each other, and inactivates the first pre-training information signal A: PRE_TRAINING_ INFO_SIG_1 into a logic low level when the logic levels are different from each other.

The second logic level comparing unit 3444 performs an exclusive NOR operation on a third comparing signal COMPARE_SIG 180° and a fourth comparing signal COMPARE_SIG 270°.

The second logic level comparing unit 3444 activates a second pre-training information signal B: PRE_TRAINING_INFO_SIG_2 into a logic high level when the logic levels of the third and fourth comparing signals COMPARE_SIG 180° and COMPARE_SIG 270° are equal to each other, and inactivates the pre-training information output signal B: PRE_TRAINING_INFO_SIG_2 into a logic low level when the logic levels are different from each other.

The logic level determining unit 3446 determines the logic level of the training information signal TRAINING_INFO_SIG in response to the first and second pre-training information signals A:PRE_TRAINING_INFO_SIG_1 and B:PRE_TRAINING_INFO_SIG_2 of the first and second logic level comparing units 3442 and 3444.

While the detailed circuit of the logic level changing unit 344 shown in FIG. 5 is an exemplary embodiment of the present invention, it may be differently formed as well. In other words, any circuit capable of performing operations of the logic level changing unit 344 to be explained hereafter may also be used in place of the detailed circuit of the logic level changing unit 344 shown in FIG. 5.

An operation of each element which is included in the circuit for performing the clock alignment training in accordance with the first embodiment of the present invention will be described as follows.

Firstly, the phase dividing unit 380 generates eight multi-system clocks MULTI_HCK 0°, MULTI_HCK 45°, MULTI_HCK 90°, MULTI_HCK 135°, MULTI_HCK 180°, MULTI_HCK 225°, MULTI_HCK 270° and MULTI_HCK 315° having a phase difference of 45° from each other in response to the system clock HCK or four multi-system clocks MULTI_HCK 0°, MULTI_HCK 90°, MULTI_HCK 180° and MULTI_HCK 270° having a phase difference of 90° from each other or two multi-system clocks MULTI_HCK 0° and MULTI_HCK 180° having a phase difference of 180° from each other.

The number of the plurality of multi-system clocks MULTI_HCK<0:N> generated in response to the system clock HCK may be changed according to various design needs. That is, the number of the plurality of multi-system clocks MULTI_HCK<0:N> generated in response to the system clock HCK as exemplified above can be two, four or eight as well as the number of the plurality of multi-system clocks MULTI_HCK<0:N> made of 16, 32 or the greater number can be generated.

Each of the phase comparing unit 342 of the phase detecting unit 340 performs an operation of activating one of the comparing signals COMPARE_SIG<0:N> when the data dividing clock DIV_WCK is in an activated state at the time of shifting a logic level of any one clock applied among the plurality of multi-system clocks MULTI_HCK<0:N>.

On the other hand, each of the phase comparing unit 342 among the constituent elements of the phase detecting unit 340 performs an operation of inactivating the comparing signals COMPARE_SIG<0:N> when the data dividing clock DIV_WCK is in an inactivated state at the time of shifting a logic level of any one clock applied among the plurality of multi-system clocks MULTI_HCK<0:N>.

The logic level changing unit 344 of the phase detecting unit 340 is classified into two operations different from each other completely.

First, the first operation activates the training information signal TRAINING_INFO_SIG to output the activated training information signal when all the comparing signals COMPARE_SIG<0:N> outputted from the plurality of phase comparing unit 342 are activated, and inactivates the training information signal TRAINING_INFO_SIG to output the inactivated training information signal when all the comparing signals COMPARE_SIG<0:N> outputted from the plurality of phase comparing unit 342 are inactivated.

The second operation inactivates the training information signal TRAINING_INFO_SIG to output the inactivated training information signal TRAINING_INFO_SIG when the number of signals in an inactivated state is greater than that of the signals in an activated state among the comparing signals COMPARE_SIG<0:N> outputted from the plurality of phase comparing unit 342, and activates the training information signal TRAINING_INFO_SIG to output the activated training information signal when the number of signals being an activated state is greater than that of the signals being an inactivated state among the comparison result signals COMPARE_SIG<0:N> outputted from the plurality of phase comparing unit 342.

Figure 6:
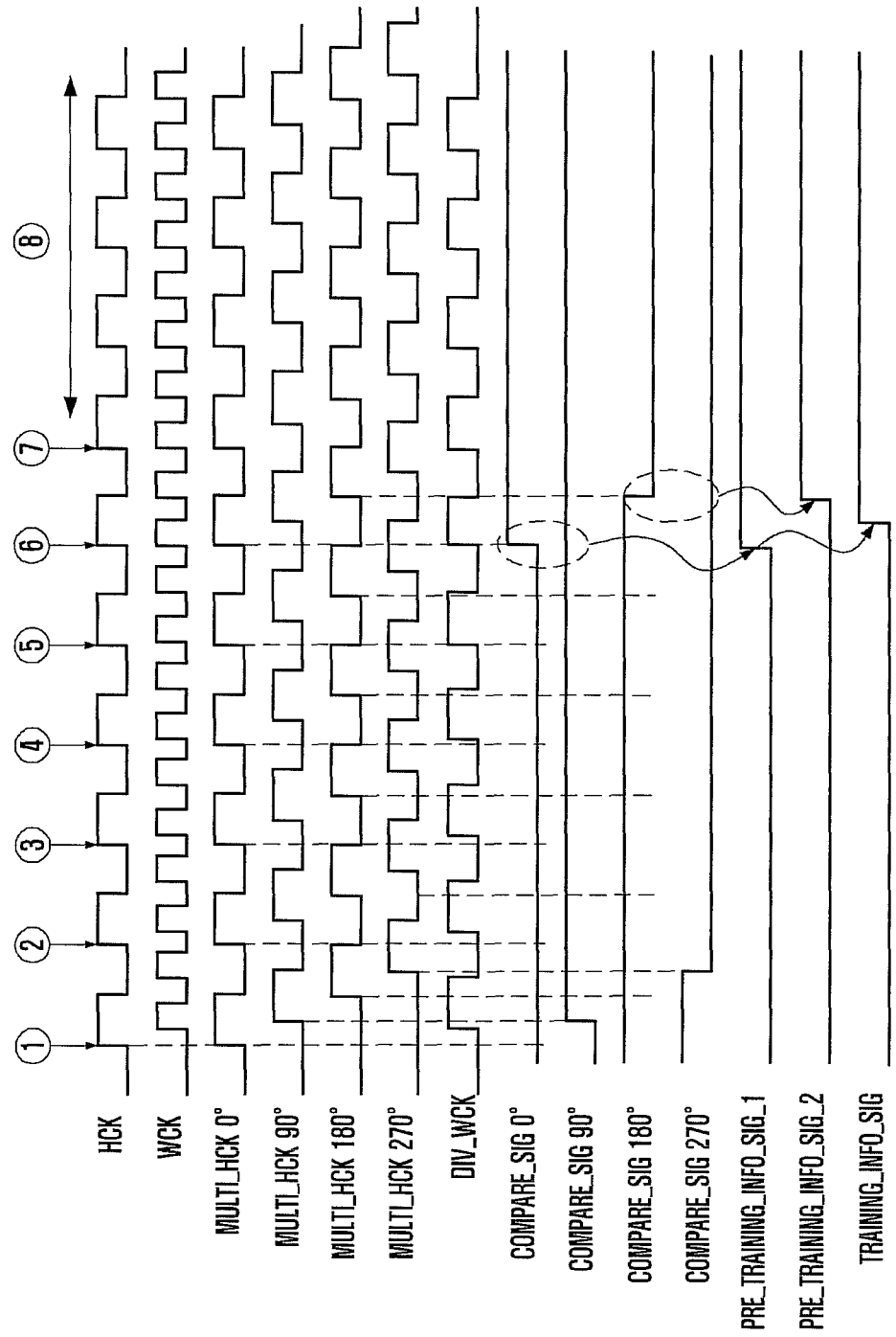
FIG. 6 is a timing diagram showing an operational waveform of the circuit for performing the clock alignment training in accordance with the first embodiment of the present invention shown in FIG. 3.

FIG. 6 is a timing diagram showing an operational waveform of the circuit for performing the clock alignment training in accordance with the first embodiment of the present invention shown in FIG. 3.

The operational waveform shown in FIG. 6 is the operation waveform of the circuit when it is assumed that the phase dividing unit 380 generates four multi-system clocks MULTI_HCK 0°, MULTI_HCK 90°, MULTI_HCK 180° and MULTI_HCK 270° having a phase difference of 90° from each other by dividing the phase of the system clock HCK, and the four phase comparing units 342 included in the phase detecting unit 340 compare the four multi-system clocks MULTI_HCK 0°, MULTI_HCK 90°, MULTI_HCK 180° and MULTI_HCK 270° with the phase of the data dividing clock DIV_WCK, respectively. It is also assumed that the comparison result signals COMPARE_SIG 0°, COMPARE_SIG 90°, COMPARE_SIG 180° and COM- PARE_SIG 270° are inputted to the logic level changing unit 344 included in the phase detecting unit 340 in parallel and thus the logic level of the training information signal TRAINING_INFO_SIG is changed.

Also, the operational waveform shown in FIG. 6 is a waveform when it is assumed that the logic level changing unit 344 of the phase detecting unit 340 performs the first operation between the two operations explained above.

Referring to FIG. 6, before the clock alignment training operation is started ①, the data clock WCK is not synchronized with the system clock HCK in phase; and as the clock alignment training operations ①-⑦ proceeds, the phase of the data clock WCK is gradually changed. As a result, the phase of the data clock WCK is synchronized with the phase of the system clock HCK from each other.

If the phase of the data clock WCK is not synchronized with the phase of the system clock HCK from each other, the clock alignment training operation for the training information signal TRAINING_INFO_SIG of a logic low level is performed, and if the phase of the data clock WCK is synchronized with the phase of the system clock HCK from each other, the training information signal TRAINING_INFO_SIG is changed to a logic high level.

That is, four multi-system clocks MULTI_HCK 0°, MULTI_HCK 90°, MULTI_HCK 180° and MULTI_HCK 270° having a phase difference of 90° from each other corresponding to the system clock HCK are generated.

At the same time, the data dividing clock DIV_WCK having the same frequency as the four multi-system clocks MULTI_HCK 0°, MULTI_HCK 90°, MULTI_HCK 180° and MULTI_HCK 270° is generated corresponding to the data clock WCK.

First, the phase of the first multi-system clock MULTI_HCK 0° among the four multi-system clocks MULTI_HCK 0°, MULTI_HCK 90°, MULTI_HCK 180° and MULTI_HCK 270° is compared with the phase of the data dividing clock DIV_WCK, and the comparison result is presented as follows.

At the time ① of starting the first period of the system clock HCK, since the data dividing clock DIV_WCK is inactivated into a logic low level at a rising edge of the first multi-system clock MULTI_HCK 0°, the first comparing signal COMPARE_SIG 0° starts the clock alignment training operation with the inactivated state of a logic low level.

At the times ②, ③, ④ and ⑤ of starting the second period to fifth period of the system clock HCK, since the data dividing clock DIV_WCK is still in the inactivated state of a logic low level at a rising edge of the first multi-system clock MULTI_HCK 0° similar to the time ① when the first period is started, the first comparing signal COMPARE_SIG 0° maintains the inactivated state of a logic low level as it is.

Subsequently, at the time ⑥ of starting the sixth period of the system clock HCK, the first comparing signal COMPARE_SIG 0° is changed from the inactivated state of a logic low level to an activated state of a logic high level while the data dividing clock DIV_WCK becomes an activated state to a logic high level at a rising edge of the first multi-system clock MULTI_HCK 0°.

Thereafter, at the times ⑦ and ⑧ of starting the periods of the remaining system clock HCK, since the data dividing clock DIV_WCK is activated to a logic high level at a rising edge of the first multi system clock MULTI_HCK 0° similar to the time ⑥ of starting the sixth period, the first comparing signal COMPARE_SIG 0° maintains the activated state of a logic high level as it is.

The comparison between the phase of the second MULTI_HCK 90° among the four multi-system clocks MULTI_HCK 0°, MULTI_HCK 90°, MULTI_HCK 180° and MULTI_HCK 270° and the data dividing clock DIV_WCK is as follows.

At the first period ① to ② of the system clock HCK, since the data dividing clock DIV_WCK is activated to a logic high level at a rising edge of the second multi system clock MULTI_HCK 90°, the second comparing signal COMPARE_SIG 90° is changed from the inactivated state of a logic low level into an activation state of a logic high level.

At the periods ② to ③, ③ to ④, ④ to ⑤ and ⑤ to ⑥, and ⑥ to ⑦ of the remaining system clock HCK, since the data dividing clock DIV_WCK is activated into a logic high level at a rising edge of the first multi-system clock MULTI_HCK 90° similar to the first period ① to ②, the second comparing signal COMPARE_SIG 90° maintains the activated state of a logic high level as it is.

The comparison between the phases of the third multi-system clock MULTI_HCK 180° among the four multi-system clocks MULTI_HCK 0°, MULTI_HCK 90°, MULTI_HCK 180° and MULTI_HCK 270° and the phase of the data dividing clock DIV_WCK is as follows.

The first and second comparing signals COMPARE_SIG 0° and COMPARE_SIG 90° outputted as the comparison result between the phases of the first and second multi-system clocks MULTI_HCK 0° and MULTI_HCK 90° and the phase of the data dividing clock DIV_WCK have a logic high level at the activated state and a logic low level at the inactivated state, respectively.

Whereas the third comparing signal COMPARE_SIG 180° and the fourth comparing signal COMPARE_SIG 270° outputted from the comparison result between the phases of the third multi-system clock MULTI_HCK 180° and the fourth multi-system clock MULTI_HCK 270° to be explained hereafter and the phase of the data dividing clock DIV_WCK are signals to be a logic low level at the activated state and a logic high level at the inactivated state, respectively.

At the first period ① to ② of the system clock HCK, since the data dividing clock DIV_WCK is activated to a logic high level at a rising edge of the third multi-system clock MULTI_HCK 180°, the third comparing signal COMPARE_SIG 180° starts to operate the clock alignment training with the inactivated state of a logic high level.

And then, at the second period to the fifth period ② to ③, ③ to ④, ④ to ⑤ and ⑤ to ⑥, since the data dividing clock DIV_WCK is in a state activated into a logic high level at a rising edge of the third multi-system clock MULTI_HCK 180° similar to the first period ① to ②, the third comparing signal COMPARE_SIG 180° maintains the inactivated state of a logic high level as it is.

Thereafter, at the sixth period ⑥ to ⑦ of the system clock HCK, the third comparing signal COMPARE_SIG 180° is changed from the inactivated state of a logic high level into an activation state of a logic low level while the data dividing clock DIV_WCK becomes the inactivated state of a logic high level at the rising edge of the third multi-system clock MULTI_HCK 180°.

Thereafter, at the period ⑧ of the remaining system clock HCK, since the data dividing clock DIV_WCK is in a state inactivated into a logic low level at a rising edge of the third multi-system clock MULTI_HCK 180° similar to the sixth period ⑥ to ⑦, the third comparing signal COMPARE_SIG 180° maintains the activated state of a logic low level as it is.

The comparison between the phases of the fourth multi-system clock MULTI_HCK 270° among the four multi-system clocks MULTI_HCK 0°, MULTI_HCK 90°, MULTI_HCK 180° and MULTI_HCK 270° and the phase of the data dividing clock DIV_WCK is as follows.

At the first period ①to ②of the system clock HCK, since the data dividing clock DIV_WCK is activated to a logic high level at a rising edge of the fourth multi-system clock MULTI_HCK 270°, the fourth comparing signal COMPARE_SIG 270° is changed from the inactivated state of a logic low level to the activated state of a logic high level.

And then, at the periods ②to ③, ③to ④, ④to ⑤, ⑤to ⑥, ⑥to ⑦and ⑧of the remaining system clock HCK, since the data dividing clock DIV_WCK is in a state inactivated into a logic low level at a rising edge of the fourth multi-system clock MULTI_HCK 270° similar to the first period ①to ②, the fourth comparing signal COMPARE_SIG 270° maintains the inactivated state of a logic low level as it is.

In this way, as the clock alignment training operation is proceeded before the start ①of the clock alignment training operation ②, ③, ④, ⑤, ⑥ and ⑦, if all the logic values of the first to fourth comparing signals COMPARE_SIG 0°, COMPARE_SIG 90°, COMPARE_SIG 180° and COMPARE_SIG 270° outputted from the plurality of phase comparing unit 342 among the elements of the phase detecting unit 340 are determined, the logic level of the training information signal TRAINING_SIG outputted from the logic level changing unit 344 among the elements of the phase detecting unit 340 according to these.

Although the second comparing signal COMPARE_SIG 90° and the fourth comparing signal COMPARE_SIG 270° are activated in the first period ①to ②of the system clock HCK, since the first comparing signal COMPARE_SIG 0° and the third comparing signal COMPARE_SIG 180° are still inactivated state, the training information signal TRAINING_INFO_SIG also maintains the inactivated state continuously.

And, in the second period to the fifth period ②to ③, ③to ④, ④to ⑤ and ⑤to ⑥, although the second comparing signal COMPARE_SIG 90° and the fourth comparing signal COMPARE_SIG 270° are still activated state similar to the first period ①to ②, since the first comparing signal COMPARE_SIG 0° and the third comparing signal COMPARE_SIG 180° are still inactivated, the training information signal TRAINING_INFO_SIG also maintains the inactivated state as it is.

Then, at the sixth period ⑥to ⑦of the system clock, since all the first to fourth comparing signals COMPARE_SIG 0°, COMPARE_SIG 90°, COMPARE_SIG 180° and COMPARE_SIG 270° become an activated state while the first comparing signal COMPARE_SIG 0° and the third comparing signal COMPARE_SIG 180° are activated, the training information signal TRAINING_INFO_SIG becomes to be activated.

Thereafter, at the period ⑧of the remaining system clock HCK, since all the first to fourth comparing signals COMPARE_SIG 0°, COMPARE_SIG 90°, COMPARE_SIG 180° and COMPARE_SIG 270° become an activated state are an activated state similar to the sixth period ⑥to ⑦, the training information signal TRAINING_INFO_SIG maintains the activated state as it is.

Since the operation of the logic level changing unit 344 of the phase detecting unit 340 referring to FIG. 6 follows the case that the circuit shown in FIG. 5 operates, as described above, the logic level of the training information signal TRAINING_INFO_SIG is not changed by comparing all the activated/inactivated states of the first to fourth comparing signals COMPARE_SIG 0°, COMPARE_SIG 90°, COMPARE_SIG 180° and COMPARE_SIG 270° at a time.

That is, the logic level of the first pre-training information signal PRE_TRAINING_INFO_SIG_1 is determined by comparing the activated/inactivated states of the first and second comparing signals COMPARE_SIG 0° and COMPARE_SIG 90°. The logic level of the second pre-training information signal PRE_TRAINING_INFO_SIG_2 is determined by comparing the activated/inactivated states of the third and fourth comparing signals COMPARE_SIG 180° and COMPARE_SIG 270°. Finally, the logic level of the training information signal TRAINING_INFO_SIG is changed according to the activated/inactivated states of the first pre-training information signal PRE_TRAINING_INFO_SIG_1 and the second pre-training information signal PRE_TRAINING_INFO_SIG_2.

However, such methods are not greatly different from the method described above, only a part to change the logic level of the training information TRAINING_INFO_SIG becomes to be a slight difference according to the activated/inactivated states of the first pre-training information signal PRE_TRAINING_INFO_SIG_1 and the second pre-training information signal PRE_TRAINING_INFO_SIG_2.

As described above, since the training information signal TRAINING_INFO_SIG is activated at the time when all the first to fourth comparing signals COMPARE_SIG 0°, COMPARE_SIG 90°, COMPARE_SIG 180° and COMPARE_SIG 270° are activated, the training information signal TRAINING_INFO_SIG is activated when the latest activated third comparing signal COMPARE_SIG 180° is activated.

As shown in FIG. 6, since the first pre-training information signal PRE_TRAINING_INFO_SIG_1 is firstly activated and the second pre-training information signal PRE_TRAINING_INFO_SIG_2 is activated lately, the training information signal PRE_TRAINING_INFO_SIG is only activated in response to the activation of the first pre-training information PRE_TRAINING_INFO_SIG_1 at the time of dividing the activation time of the first pre-training information signal PRE_TRAINING_INFO_SIG and the activation time of the second pre-training information signal PRE_TRAINING_INFO_SIG_2 in half, it is noted that there is not much difference substantially.

If the first embodiment of the present invention is applied as explained above, the plurality of multi-system clocks MULTI_HCK<0:N> are generated by dividing the phase of the system clock HCK by a preset interval, the phase difference between the plurality of multi-system clocks MULTI_HCK<0:N> having the phase difference of the preset size and the data dividing clock DIV_WCK is detected, respectively, and an influence to the change of the logic level of the training information signal TRAINING_INFO_SIG can be minimized by changing the logic level of the training information signal TRAINING_INFO_SIG as a final phase detection result based on the result although noises or distortion are generated at a portion of the transmission path during transmitting the plurality of multi-system clock MULTI_HCK<0:N>.

As a result, the stable clock alignment training operation can be performed even in the semiconductor device operating at higher speed.

[Embodiment 2]

Figure 7:
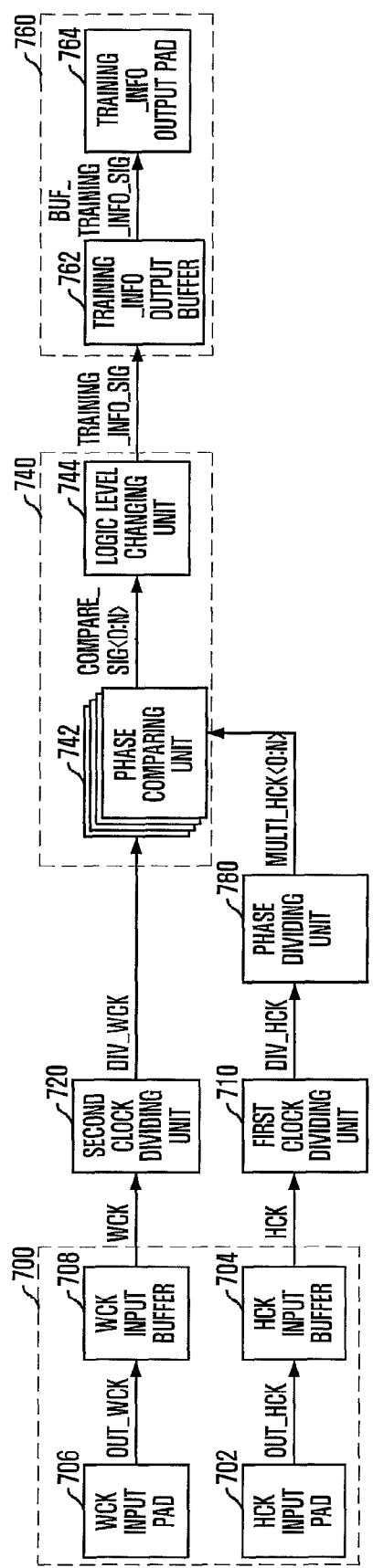
FIG. 7 is a block diagram representing a circuit for performing clock alignment training in accordance with a second embodiment of the present invention.

FIG. 7 is a block diagram showing a circuit for performing the clock alignment training in accordance with a second embodiment of the present invention.

Referring to FIG. 7, the circuit includes a clock input unit 700, a first clock dividing unit 710, a phase dividing unit 780, a second clock dividing unit 720, a phase detecting unit 740 and a signal transmitting unit 760.

The clock input unit 700 receives an external data clock OUT_WCK and an external system clock OUT_HCK to output a system clock HCK to synchronize input timings of an address signal and a command signal and a data clock WCK to synchronize input timings of data signals. The data clock WCK has a frequency higher than the system clock HCK. The first clock dividing unit 710 divides the frequency of the system clock HCK by the first rate to output the divided result as a system dividing clock DIV_HCK.

The phase dividing unit 780 generates a plurality of multi-system dividing clocks MULTI_DIV_HCK<0:N> having a phase difference of a preset size respectively in response to the system dividing clock DIV_HCK. The second clock dividing unit 720 generates a data dividing clock DIV_WCK by dividing the frequency of the data clock WCK with a second rate greater than a first rate in order that the data dividing clock DIV_WCK has the same frequency as the plurality of multi-system dividing clocks MULTI_DIV_HCK<0:N>.

The phase detecting unit 740 detects the phase differences between the plurality of multi-system dividing clocks MULTI_DIV_HCK<0:N> and the data dividing clock DIV_WCK respectively and generates a training information signal TRAINING_INFO_SIG corresponding to the detection result. The signal transmitting unit 760 transmits the training information signal TRAINING_INFO_SIG to an external controller.

Herein, the phase detecting unit 740 includes a plurality of phase comparing units 742 for comparing the phases between the plurality of multi-system dividing clocks MULTI_DIV_HCK<0:N> and the data dividing clock DIV_WCK respectively and a logic level changing unit 744 for changing a logic level of the training information signal TRAINING_INFO_SIG in response to a plurality of comparing signals COMPARE_SIG<0:N> output from the phase comparing units 742.

The clock input unit 700 includes a system clock input pad 702, a system clock input buffer 704, a data clock input pad 706 and a data clock input buffer 708.

The system clock input pad 702 receives the external system clock OUT_HCK applied from the external controller. The system clock input buffer 704 outputs the system clock HCK by buffering the external system clock OUT_HCK transmitted through the system clock input pad 702.

The data clock input pad 706 receives the external data clock OUT_WCK applied from the external controller. The external data clock OUT_WCK has a frequency higher than that of the external system clock OUT_WCK applied from the external controller. The data clock input buffer 708 outputs the data clock WCK by buffering the external data clock OUT_WCK transmitted through the data clock input pad 706.

Also, the signal transmitting unit 760 includes a training information signal output buffer 762 and a training information signal output pad 764.

The training information signal output buffer 762 outputs a buffered training information signal BUF_TRAINING_INFO_SIG by buffering the training information signal TRAINING_INFO_SIG. The training information signal output pad 764 transmits the buffered training information signal BUF_TRAINING_INFO_SIG buffered at the training information signal output buffer 762 to the external controller.

Each of the elements of the circuit for performing the clock alignment training in accordance with the present invention based on the above-described configuration is explained as follows.

Firstly, the second phase dividing unit 720 includes generates eight multi-system clocks MULTI_HCK 0°, MULTI_HCK 45°, MULTI_HCK 90°, MULTI_HCK 135°, MULTI_HCK 180°, MULTI_HCK 225°, MULTI_HCK 270° and MULTI_HCK 315° having the phase difference of 45° respectively or four multi-system clocks MULTI_HCK 0°, MULTI_HCK 90°, MULTI_HCK 180°, MULTI_HCK 270° and MULTI_HCK 315° having the phase difference of 90° respectively or two multi-system clocks MULTI_HCK 0° and MULTI_HCK 180° having the phase difference of 180° respectively in response to the system clock HCK.

For reference, the number of the plurality of multi-system dividing clocks MULTI_DIV_HCK<0:N> generated in response to the system clock HCK can be changed according to the purpose of a designer. That is, the number of the plurality of multi-system dividing clocks MULTI_DIV_HCK<0:N> generated in response to the system clock HCK as exemplified above can be two, four or eight as well as the number of the plurality of multi-system dividing clocks MULTI_DIV_HCK<0:N> made of 16, 32 or the greater number can be generated.

Each of the phase comparing units 742 among the constituent elements of the phase detecting unit 740 performs the operation of activating the comparing signals COMPARE_SIG<0:N> outputted when the data dividing clock DIV_WCK is an activated state at the time of shifting the logic level of any one clock applied among the plurality of multi-system dividing clocks MULTI_DIV_HCK<0:N>.

On the contrary, each of the phase comparing units 742 among the elements of the phase detecting unit 740 performs the operation of inactivating the comparing signals COMPARE_SIG<0:N> outputted when the data dividing clock DIV_WCK is an inactivated state at the time of shifting the logic level of any one clock applied among the plurality of multi-system dividing clocks MULTI_DIV_HCK<0:N>.

The logic level changing unit 744 among the elements of the phase detecting unit 740 can be divided two methods different from each other.

First, the first operation activates the training information signal TRAINING_INFO_SIG to output the activated training information signal when all the signals COMPARE_SIG<0:N> outputted from the plurality of phase comparing unit 742 are activated, and inactivates the training information signal TRAINING_INFO_SIG to output the inactivated training information signal when all the signals COMPARE_SIG<0:N> outputted from the plurality of phase comparing unit 742 are inactivated.

The second operation inactivates the training information signal TRAINING_INFO_SIG to output the inactivated training information signal when the number of signals being an inactivated state is greater than that of the signals being an activated state among the signals COMPARE_SIG<0:N> outputted from the plurality of phase comparing unit 742, and activates the training information signal TRAINING_INFO_SIG to output the activated training information signal when the number of signals being an activated state is greater than that of the signals being an inactivated state among the comparison result signals COMPARE_SIG<0:N> outputted from the plurality of phase comparing unit 742.

FIG. 8 is a timing diagram illustrating an operational waveform of the circuit for performing the clock alignment training in accordance with the second embodiment of the present invention shown in FIG. 7.

Herein, the operational waveform shown in FIG. 8 is the operation waveform of the circuit when it is assumed that the phase dividing unit 780 generates four multi-system clocks MULTI_HCK 0°, MULTI_HCK 90°, MULTI_HCK 180° and MULTI_HCK 270° having a phase difference of 90° from each other by dividing the phase of the system clock HCK, and the four phase comparing units 742 included in the phase detecting unit 740 compare the four multi-system clocks MULTI_HCK 0°, MULTI_HCK 90°, MULTI_HCK 180° and MULTI_HCK 270° having a phase difference of 90° from each other with the phase of the data dividing clock DIV_WCK. It is also assumed that the comparison result signals COMPARE_SIG 0°, COMPARE_SIG 90°, COMPARE_SIG 180° and COMPARE_SIG 270° are inputted to the logic level changing unit 744 included in the phase detecting unit 740 in parallel and thus the logic level of the training information signal TRAINING_INFO_SIG is changed.

Also, the operational waveform shown in FIG. 8 is a waveform at the time of being operated assuming that the logic level changing unit 744 among the elements of the phase detecting unit 740 performs the first operation among the two operations explained in the above.

Also, under the principle that the system clock HCK has a frequency higher than that of the data clock WCK two times, the operational waveform is a waveform operated assuming that the system dividing clock DIV_HCK is generated by dividing the frequency of the system clock HCK in two times in the first clock dividing unit 710, and the data dividing clock DIV_WCK is generated by dividing the frequency of the data clock WCK in four times at the second clock dividing unit 720.

Referring to FIG. 8, before the clock alignment training operation is started ①, since the data clock WCK is not synchronized with the system clock HCK in phase, the data dividing clock WCK obtained by dividing the frequency of the data clock WCK by four is not synchronized with the system dividing clock DIV_HCK obtained by dividing the frequency of the system clock by two times in phase; and as the clock alignment training operations ①, ②, ③, and ④ proceeds, the phase of the data clock WCK is gradually changed. As a result, the phase of the data dividing clock DIV_WCK obtained by dividing the frequency of the data clock WCK by four is changed, and finally the phase of the data dividing clock DIV_WCK obtained by dividing the frequency of the data clock WCK by four is synchronized with the phase of the system dividing clock DIV_HCK obtained by dividing the frequency of the system clock HCK by two when the phase of the data clock WCK is synchronized with that of the system clock HCK from each other.

Also, at the state that the data dividing clock DIV_WCK is not synchronized with the system dividing clock DIV_HCK from each other since the phase of the data clock WCK is not synchronized with the phase of the system clock HCK from each other, the training information signal TRAINING_INFO_SIG under the state of a logic low level proceeds the clock alignment training operation, thereby changing into a logic high level at the state that the phase of the data dividing clock DIV_WCK is synchronized with the phase of the system dividing clock DIV_HCK from each other.

To be specific, four multi-system dividing clocks MULTI_DIV_HCK 0°, MULTI_DIV_HCK 90°, MULTI_DIV_HCK 180° and MULTI_DIV_HCK 270° having a phase difference of 90° from each other are generated from the system dividing clock DIV_HCK which is generated by dividing the frequency of the system clock HCK by two.

At the same time, the data dividing clock DIV_WCK having the same frequency as the four multi-system dividing clocks MULTI_DIV_HCK 0°, MULTI_DIV_HCK 90°, MULTI_DIV_HCK 180° and MULTI_DIV_HCK 270° is generated from the data clock WCK.

Firstly, if the phase of the first multi-system dividing clock MULTI_DIV_HCK 0° among the four multi-system dividing clocks MULTI_DIV_HCK 0°, MULTI_DIV_HCK 90°, MULTI_DIV_HCK 180° and MULTI_DIV_HCK 270° is compared with the phase of the data dividing clock DIV_WCK, the comparison result is as follows.

At the time ① of starting the first period of the system clock, since the data dividing clock DIV_WCK is a state inactivated into a logic low level at a rising edge of the first multi-system dividing clock MULTI_DIV_HCK 0°, the first comparing signal COMPARE_SIG 0° starts the clock alignment training operation with the inactivated state of a logic low level.

At the times ③ and ⑤ of starting the third period and fifth period of the system clock HCK, since the data dividing clock DIV_WCK is a in state inactivated into a logic low level at a rising edge of the first multi-system dividing clock MULTI_DIV_HCK 0° similar to the time ① when the first period is started, the first comparing signal COMPARE_SIG 0° maintains the inactivated state of a logic low level as it is.

Subsequently, at the time ⑦ of starting the seventh period of the system clock HCK, the first comparing signal COMPARE_SIG 0° is changed from the inactivated state of a logic low level to the activated state of a logic high level while the data dividing clock DIV_WCK becomes an activated state to a logic high level at a rising edge of the first multi-system dividing clock MULTI_DIV_HCK 0°.

Thereafter, at the time ⑨ of starting the periods of the remaining system clock HCK, since the data dividing clock DIV_WCK is activated to a logic high level at a rising edge of the first multi system dividing clock MULTI_DIV_HCK 0° similar to the time ⑦ of starting the seventh period, the first comparing signal COMPARE_SIG 0° maintains the activated state of a logic high level as it is.

The comparison between the phase of the second multi-system dividing clock MULTI_DIV_HCK 90° among the four multi-system dividing clocks MULTI_DIV_HCK 0°, MULTI_DIV_HCK 90°, MULTI_DIV_HCK 180° and MULTI_DIV_HCK 270° and the data dividing clock DIV_WCK is as follows.

At the first two periods ① to ② and ② to ③ of the system clock HCK, since the data dividing clock DIV_WCK is activated to a logic high level at a rising edge of the second multi-system dividing clock MULTI_DIV_HCK 90°, the second comparing signal COMPARE_SIG 90° is changed from the inactivated state of a logic low level into an activation state of a logic high level.

Subsequently, at the periods ③ to ④, ④ to ⑤, ⑤ to ⑥, ⑥ to ⑦, ⑦ to ⑧, ⑧ to ⑨ and ⑨ of the remaining system clock HCK, since the data dividing clock DIV_WCK is in a state of being activated into a logic high level at a rising edge of the second multi-system dividing clock MULTI_DIV_HCK 90° similar to the first two periods ① to ② and ② to ③ the second comparing signal COMPARE_SIG 90° maintains the activated state of a logic high level as it is.

The comparison between the phases of the third multi-system dividing clock MULTI_DIV_HCK 180° among the four multi-system dividing clocks MULTI_DIV_HCK 0°, MULTI_DIV_HCK 90°, MULTI_DIV_HCK 180° and MULTI_DIV_HCK 270° and the phase of the data dividing clock DIV_WCK is as follows.

Herein, the first and second comparing signals COMPARE_SIG 0° and COMPARE_SIG 90° outputted as the comparison result between the phases of the first and second multi-system dividing clocks MULTI_DIV_HCK 0° and MULTI_DIV_HCK 90° and the phase of the data dividing clock DIV_WCK are a logic high level at the activated state or a logic low level at the inactivated state, respectively.

Whereas the third comparing signal COMPARE_SIG 180° and the fourth comparing signal COMPARE_SIG 270° outputted from the comparison result between the phases of the third multi-system dividing clock MULTI_DIV_HCK 180° and the fourth multi-system dividing clock MULTI_DI- V_HCK 270° to be explained hereafter and the phase of the data dividing clock DIV_WCK are signals to be a logic low level at the activated state and a logic high level at the inactivated state, respectively.

At the first period ① to ② and ② to ③ of the system clock HCK, since the data dividing clock DIV_WCK is activated to a logic high level at a rising edge of the third multi-system dividing clock MULTI_HCK 180°, the third comparing signal COMPARE_SIG 180° starts to operate the clock alignment training with the inactivated state of a logic high level.

Subsequently, at the second period ③ to ④ and ④ to ⑤ and the third period ⑤ to ⑥ and ⑥ to ⑦, since the data dividing clock DIV_WCK is in a state activated into a logic high level at a rising edge of the third multi-system dividing clock MULTI_DIV_HCK 180° similar to the first period ① to ② and ② to ③ the third comparing signal COMPARE_SIG 180° maintains the inactivated state of a logic high level as it is.

Thereafter, at the fourth two periods ⑦ to ⑧ and ⑧ to ⑨ of the system clock HCK, the third comparing signal COMPARE_SIG 180° is changed from the inactivated state of a logic high level into an activation state of a logic low level while the data dividing clock DIV_WCK becomes the inactivated state of a logic high level at the rising edge of the third multi-system dividing clock MULTI_DIV_HCK 180°.

Thereafter, at the period ⑨) of the remaining system clock HCK, since the data dividing clock DIV_WCK is in a state inactivated into a logic low level at a rising edge of the third multi-system dividing clock MULTI_DIV_HCK 180° similar to the fourth two periods ⑦ to ⑧ and ⑧ to ⑨, the third comparing signal COMPARE_SIG 180° maintains the activated state of a logic low level as it is.

The comparison between the phases of the fourth multi-system dividing clock MULTI_DIV_HCK 270° among the four multi-system dividing clocks MULTI_DIV_HCK 0°, MULTI_DIV_HCK 90°, MULTI_DIV_HCK 180° and MULTI_DIV_HCK 270° and the phase of the data dividing clock DIV_WCK is as follows.

At the first two periods ① to ② and ② to ③ of the system clock HCK, since the data dividing clock DIV_WCK is inactivated to a logic low level at a rising edge of the fourth multi-system dividing clock MULTI_DIV_HCK 270°, the fourth comparing signal COMPARE_SIG 270° is changed from the inactivated state of a logic high level to the activated state of a logic low level.

Subsequently, at the periods ③ to ④, ④ to ⑤, ⑤ to ⑥, ⑥ to ⑦, ⑦ to ⑧, ⑧ to ⑨ and ⑨ of the remaining system clock HCK, since the data dividing clock DIV_WCK is in a state inactivated into a logic low level at a rising edge of the fourth multi-system dividing clock MULTI_DIV_HCK 270° similar to the first two periods ① to ② and ② to ③, the fourth comparing signal COMPARE_SIG 270° maintains the activated state of a logic low level as it is.

In this way, as the clock alignment training operation is performed before the start ① of the clock alignment training operation ②, ③, ④, ⑤, ⑥, ⑦, ⑧ and ⑨, if all the logic values of the first to fourth comparing signals COMPARE_SIG 0°, COMPARE_SIG 90°, COMPARE_SIG 180° and COMPARE_SIG 270° outputted from the plurality of phase comparing unit 742 among the constituent elements of the phase detecting unit 740 are determined, the logic level of the training information signal TRAINING_SIG outputted from the logic level changing unit 744 among the elements of the phase detecting unit 740 according to these.

To be specific, although the second comparing signal COMPARE_SIG 90° and the fourth comparing signal COM-PARE_SIG 270° are activated in the first two periods ① to ② and ② to ③ of the system clock HCK, since the first comparing signal COMPARE_SIG 0° and the third comparing signal COMPARE_SIG 180° are still inactivated state, the training information signal TRAINING_INFO_SIG also maintains the inactivated state continuously.

In the second two periods ③ to ④ and ④ to ⑤ to the third two periods ⑤ to ⑥ and ⑥ to ⑦, although the second comparing signal COMPARE_SIG 90° and the fourth comparing signal COMPARE_SIG 270° are still in an activated state similar to the first two periods ① to ② and ② to ③, since the first comparing signal COMPARE_SIG 0° and the third comparing signal COMPARE_SIG 180° are still in an inactivated state, the training information signal TRAINING_ INFO_SIG also maintains the inactivated state as it is.

Then, at the fourth two periods ⑦ to ⑧ and ⑧ to ⑨ of the system clock, since all the first to fourth comparing signals COMPARE_SIG 0°, COMPARE_SIG 90°, COMPARE_SIG 180° and COMPARE_SIG 270° become an activated state while the first comparing signal COMPARE_SIG 0° and the third comparing signal COMPARE_SIG 180° are activated, the training information signal TRAINING_INFO_SIG becomes to be activated.

Thereafter, at the period ⑨ of the remaining system clock HCK, since all the first to fourth comparing signals COMPARE_SIG 0°, COMPARE_SIG 90°, COMPARE_SIG 180° and COMPARE_SIG 270° become an activated state are an activated state similar to the fourth two periods ⑦ to ⑧ and ⑧ to ⑨, the training information signal TRAINING_INFO_SIG maintains the activated state as it is.

Applying the second embodiment of the present invention as examined above, a plurality of multi-system dividing clock MULTI_DIV_HCK<0:N> is generated by dividing (e.g., creating different phases of a signal) the phase of the system clock at a preset interval, the phase differences between the plurality of multi-system dividing clocks MULTI_DIV_HCK<0:N> having the phase difference of the preset size and the data dividing clock DIV_WCK are detected, respectively, although the noises or distortion are generated in a part of the transmission path during the transmission of the plurality of the multi-system dividing clocks MULTI_DIV_HCK<0:N> by changing the logic level of the training information signal TRAINING_INFO_SIG as a final phase detection result based on the result, the influence on the change of the logic level of the training information signal TRAINING_INFO_SIG can be minimized.

Also, the system clock HCK and the data clock WCK may be divided differently from the first embodiment of the present invention as explained above, by using a method for detecting the phase difference of the divided clock, in the semiconductor device operating at higher speed, the clock alignment training operation can be performed stably more stable than a circuit for performing the clock alignment training operation in accordance with the first embodiment of the present invention.

While the present invention has been described with respect to the specific embodiments, it will be apparent to those skilled in the art that various changes and modifications may be made without departing from the spirit and scope of the invention as defined in the following claims.

For example, the logic gate and transistor exemplified in the above embodiments can be differently implemented in position and type according to the polarity of the signal inputted thereto.

Embodiments of the present invention relates to a method for generating a plurality of multi-system clocks by dividing the phase of the system clock in a preset interval, detecting each of the plurality of multi-system clocks and the phase of the data clock at the same time, extracting the final phase detection result based on the result, although the noises are generated in a part of the transmission path among the transmission paths of the plurality of multi-system clock, it has an advantage that the noises do not reflect on the final phase detection result.

Therefore, the semiconductor device of the present invention may be useful by performing the clock alignment training operation stably even when it operates at high frequency.

What is claimed is:

1. A semiconductor device, comprising:
a clock input unit configured to receive a system clock and a data clock externally;
a phase dividing unit configured to generate a plurality of multi-system clocks in response to the system clock, wherein each of the multi-system clocks has an individual phase difference;
a phase detecting unit configured to detect phase differences between one of the plurality of multi-system clocks and the data clock to generate a training information signal in response to the detection result; and
a signal transmitting unit configured to transmit the training information signal,
wherein the phase detecting unit includes:
a plurality of phase comparing units configured to compare phases between each of the plurality of multi-system clocks and the data clock, respectively, to output a plurality of comparison signals; and
a logic level changing unit configured change a logic level of the training information signal in response to the plurality of comparison signals,
wherein the data clock and the plurality of multi-system clocks have the same frequency.

2. The semiconductor device of claim 1, wherein the phase dividing unit is configured to generate the plurality of multi-system clocks with a phase difference of 45° from each other, a phase difference of 90° from each other, or a phase difference of 180° from each other in response to the system clock.

3. The semiconductor device of claim 1, wherein each of the phase comparing units is configured to determine whether the comparison signals are activated or not according to an activation state of the data clock at times when a logic level of any one clock among the plurality of multi-system clocks is being changed.

4. The semiconductor device of claim 1, wherein the logic level changing unit is configured to activate the training information signal to output the activated training information signal when all the plurality of comparison signals outputted from the plurality of phase comparing units are activated.

5. The semiconductor device of claim 1, wherein the logic level changing unit is configured to inactivate the training information signal to output the inactivated training information signal when all the plurality of comparison signals outputted from the plurality phase comparison units are inactivated.

6. The semiconductor device of claim 1, wherein the logic level changing unit is configured to inactivate the training information signal to output the inactivated training information signal when the number of the comparison signals of inactivated states is greater than the number of the comparison signals of activated states among the comparison signals outputted from the plurality of the phase comparing units.

7. The semiconductor device of claim 1, wherein the logic level changing unit is configured to activate the training information signal to output the activated training information signal when the number of the comparison signals of activated states is greater than the number of the comparison signals of inactivated states among the comparison signals outputted from the plurality of the phase comparing units.

8. A semiconductor device, comprising:
a clock input unit configured to receive a system clock and a data clock externally;
a phase dividing unit configured to generate a plurality of multi-system clocks each having an individual phase difference based on the system clock;
a clock dividing unit configured to generate a data dividing clock with the same frequency as the plurality of multi-system clocks by dividing a frequency of the data clock;
a phase detecting unit configured to detect phase differences between the plurality of multi-system clocks and the data dividing clock to generate a training information signal in response to the detection result; and
a signal transmitting unit configured to transmit the training information signal,
wherein the phase detecting unit includes:
a plurality of phase comparing units configured to compare phases between each of the plurality of multi-system clocks and the data dividing clock, respectively, to output a plurality of comparison signals; and
a logic level changing unit configured to change a logic level of the training information signal in response to the plurality of comparison signals.

9. The semiconductor device of claim 8, wherein the phase dividing unit is configured to generate the plurality of multi-system clocks with a phase difference of 45° from each other, a phase difference 90° from each other, or a phase difference 180° from each other in response to the system clock.

10. The semiconductor device of claim 8, wherein each of the phase comparing units determines whether the comparison signals are activated or not according to an activation state of the data dividing clock at times when a logic level of any one clock among the plurality of multi-system clocks is being changed.

11. The semiconductor device of claim 8, wherein the logic level changing unit is configured to activate the training information signal to output the activated training information signal when all the plurality of comparison signals outputted from the plurality of phase comparing units are activated.

12. The semiconductor device of claim 8, wherein the logic level changing unit is configured to inactivate the training information signal to output the inactivated training information signal when all the plurality of comparison signals outputted from the plurality phase comparison units are inactivated.

13. The semiconductor device of claim 8, wherein the logic level changing unit is configured to inactivate the training information signal to output the inactivated training information signal when the number of the comparison signals of inactivated states is greater than the number of the comparison signals of activated states among the comparison signals outputted from the plurality of the phase comparing units.

14. The semiconductor device of claim 8, wherein the logic level changing unit is configured to activate the training information signal to output the activated training information signal when the number of the comparison signals of activated states is greater than the number of the comparison signals of inactivated states among the comparison signals outputted from the plurality of the phase comparing units.

15. A semiconductor device, comprising:
a clock input unit configured to receive a system clock and a data clock from outside;

a first clock dividing unit configured to divide a frequency of the system clock by a first ratio to output a system dividing clock;

a phase dividing unit configured to generate a plurality of multi-system dividing clocks having a phase difference of a dedicated size respectively in response to the system dividing clock;

a second clock dividing unit configured to divide a frequency of the data clock by a second ratio to generate a data dividing clock;

a phase detecting unit configured to detect phase differences between the plurality of multi-system dividing clocks and the data dividing clock respectively to generate a training information signal in response to the detection result; and a signal transmitting unit configured to transmit the training information signal, wherein the phase detecting unit includes:

a plurality of phase comparing units configured to compare phases between the plurality of multi-system dividing clocks and the data dividing clock, respectively, to output a plurality of comparison signals; and a logic level changing unit configured to change a logic level of the training information signal in response to the comparison signals output from the phase comparing units, wherein the data dividing clock and the plurality of multi-system dividing clocks have the same frequency.

16. The semiconductor device of claim 15, wherein the phase dividing unit is configured to generate the plurality of multi-system dividing clocks with a phase difference of 45° from each other, a phase difference 90° from each other or a phase difference 180° from each other in response to the system dividing clock.

17. The semiconductor device of claim 15, wherein each of the phase comparing units is configured to determine whether the comparison signals are activated or not according to activation state of the data dividing clock at a time when a logic level of any one clock among the plurality of multi-system dividing clocks is changed.

18. The semiconductor device of claim 15, wherein the logic level changing unit is configured to activate the training information signal to output the activated training information signal when all the plurality of comparison signals outputted from the plurality of phase comparing units are activated.

19. The semiconductor device of claim 15, wherein the logic level changing unit is configured to inactivate the training information signal to output the inactivated training information signal when all the plurality of comparison signals outputted from the plurality phase comparison units are inactivated.

20. The semiconductor device of claim 15, wherein the logic level changing unit is configured to inactivate the training information signal to output the inactivated training information signal when the number of the comparison signals of inactivated states is greater than the number of the comparison signals of activated states among the comparison signals outputted from the plurality of the phase comparing units.

21. The semiconductor device of claim 15, wherein the logic level changing unit is configured to activate the training information signal to output the activated training information signal when the number of the comparison signals of activated states is greater than the number of the comparison signals of inactivated states among the comparison signals outputted from the plurality of the phase comparing units.

* * * * *